United States Patent [19]

Brisson

[11] Patent Number: 4,947,531
[45] Date of Patent: Aug. 14, 1990

[54] INSERTION METHOD FOR CHIP CARDS

[75] Inventor: Pierre Brisson, Wassermaar, Netherlands

[73] Assignee: Gemplus Card International, Aix en Provence, France

[21] Appl. No.: 314,770

[22] Filed: Feb. 23, 1989

[30] Foreign Application Priority Data

Feb. 26, 1988 [FR] France ................... 88 02352

[51] Int. Cl.⁵ .................. B23P 11/00; B29C 00/00
[52] U.S. Cl. .................... 29/446; 264/230; 264/272.17; 283/83; 283/904
[58] Field of Search ........... 264/230, 272.17, 342 R, 264/DIG. 71; 283/83, D904; 40/628, 629; 29/835, 446, 447; 174/8, 52.1, 52.4

[56] References Cited

U.S. PATENT DOCUMENTS

| | | | |
|---|---|---|---|
| 4,417,413 | 11/1983 | Hoppe et al. | 283/83 X |
| 4,474,292 | 10/1984 | Haghiri-Tehrani et al. | 283/904 X |
| 4,679,292 | 7/1987 | Mead | 29/447 |
| 4,754,538 | 7/1988 | Stewart, Jr. et al. | 29/447 X |

FOREIGN PATENT DOCUMENTS 63-4469 6/1988 Japan .

Primary Examiner—Jan H. Silbaugh
Assistant Examiner—Christopher A. Fiorilla
Attorney, Agent, or Firm—Roland Plottel

[57] ABSTRACT

A method for insertion of active components in chip cards. A card is made with a cavity, whose edges are formed from a material having shape memorization properties. The initial shape of the cavity at ordinary temperature is that of a basin having dimensions for housing an integrated circuit micromodule, with overhanging edges which do not allow the micromodule to go out of the cavity or to be inserted into the cavity. The card is then plastically deformed with the overhanging edges pushed back a sufficient distance and the integrated circuit micromodule is inserted. Finally, the card is heated to a temperature at which its shape memorization effect is displayed, and the plastically deformed edges of the cavity again become elastic and resume their initial overhanging shape.

1 Claim, 1 Drawing Sheet

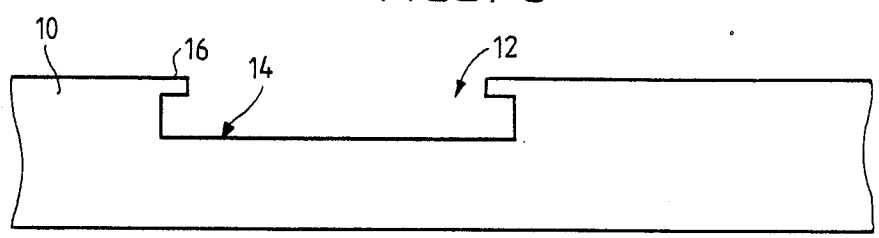
FIG_1-a
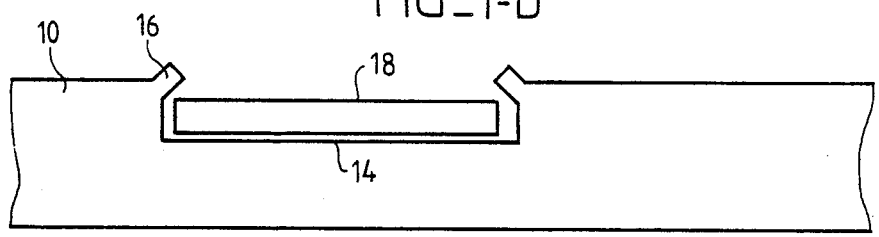
FIG_1-b
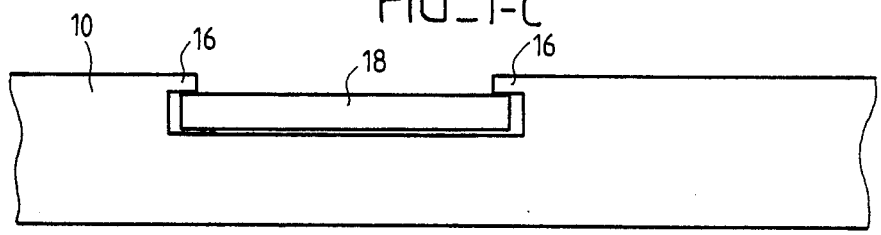
FIG_1-c

INSERTION METHOD FOR CHIP CARDS

BACKGROUND OF THE INVENTION

1. Field of the Invention

The present invention concerns the insertion of components designed to form the active part of so-called chip cards.

2. Description of the Prior Art

Chip cards, which most usually have a credit card format of a few centimeters square with a thickness of about 1 or 2 millimeters, are most often manufactured as follows: to begin with, an integrated circuit chip is soldered to a small printed circuit formed by an insulating film (made of polyimide for example) coated with etched conductors. The chip is soldered by its rear face to a conductive zone of the printed circuit, and connecting wires are soldered between contacts of the chip and other conductive zones of the printed circuit. Then the chip and the printed circuit are coated with a thermoplastic protective insulating resin (epoxy resin), while letting conductive zones, which will subsequently be used as contacts for access to the integrated circuit when it is incorporated in a card, to project beyond this coating. Thus, what is called a micromodule, containing an integrated circuit chip and its access contacts, is made. It is this micromodule that has to be inserted in a credit card format card.

In the inserting operation, the micromodule is placed in a cavity formed in a card made of plastic material (polyvinyl chloride) and then the plastic material of the card is made to adhere to the thermoplastic resin coating the micromodule, for example by using a spot of bonder between these two elements. The micromodule gets solidly joined to the card, and the assembly is over.

It has been noted, however, that the adhesion is not as lasting as might be wished. This is true especially for cards intended for intensive use by the general public. Indeed, cards intended for use by the general public are often handled without much care and they may happen to undergo exaggerated twisting, bending and other stresses. Moreover since the public wishes these cards to take up as little space as possible and, preferably, to be as flat as possible so that they can be easily slipped into wallets, it is even more difficult for the cards to withstand these bending and twisting stresses.

Experience shows that the micromodule of the chip card tends to get separated following repeated bending of the card which makes it unusable because it can no longer be inserted conveniently in card readers.

This is why the invention proposes a new method for the fabrication of cards which not only has the advantage of increasing resistance to stresses, especially resistance to the loosening of the micromodule but is also very easy to use.

FIGS. 1A, 1B, and 10C are sectional views of a chip card with a micromodule, showing successive stages of assembly according to an aspect of the invention.

Like elements in each figure bear like legend.

According to the invention, there is proposed a method for the assembly of integrated circuit micromodules in chip cards wherein, first of all, a card 10 with a cavity 12 is made, with at least its edges being formed by a material having shape memorizing properties, the initial shape of the cavity at ordinary temperature being that of a basin having a bottom 14 and edges 16 that partially overhang the bottom and having dimensions that enable the housing of an integrated circuit micromodule, where, however, the overhanging edges of the cavity do not allow a micromodule of this type to go out of the cavity or to be inserted therein; then the card is plastically deformed to push the overhanging edges back by a sufficient distance to enable the insertion of a micromodule 18; then, in the card thus deformed plastically, an integrated circuit micromodule is inserted; finally, the card is carried to a temperature at which a shape memorizing effect is displayed, through which the plastically deformed edges of the cavity again become elastic and resume their initial overhanging shape.

The term "shape memorizing properties" implies a property of certain materials, more particularly certain metallic alloys such as nickel and titanium alloys but also synthetic organic materials, wherein they can be deformed beyond their limit of elasticity, their deformation becoming plastic and hence permanent, but wherein they they recover their initial shape by heating or cooling, exactly as if the deformation had not gone beyond the limit of elasiticity.

The advantage that can be derived from the manufacture of chip cards in the above-mentioned context cards can be seen. The chip can be closed by overhanging edges, which has not been done until now, and consequently, there is an appreciable improvement in the resistance of the micromodule to tearing or loosening in the presence of card bending or twisting stresses. Furthermore, the closing of the cavity by overhanging edges is done by a very simple procedure since it is a simple heating or cooling operation.

If the shape memorizing material used is electrically insulating, it can be used as such to form the edges of the cavity. If it is conductive or insufficiently insulating, it would be preferable to cover the edges of the cavity and, if necessary, the bottom with a thermoplastic resin film just before introducing the micromodule (but after the plastic deformation imposed on the edges of the cavity). This film will correspond in shape to the edges of the cavity both when they are being plastically deformed and when they return, elastically, to their initial overhanging position. Thus, the access contacts of the micromodule will be prevented from being shortcircuited by the overhanging features.

What is claimed is:

1. A method for the assembly of an integrated circuit micromodule on a chip card comprising:
   first making the card having a cavity therein with an initial shape at ordinary temperature being that of a basin having a bottom and edges that partially overhang the bottom, at least the edges being formed of a material having shape memorizing properties, the cavity having dimensions that provide for housing the integrated circuit micromodule, the edges overhanging the cavity to such an extent that they prevent the micromodule from being inserted into or going out of the cavity; then plastically deforming the card to push the edges back by a sufficient distance to enable insertion of the micromodule:
   then inserting the micromodule into the cavity of the card; and finally heating the card to a temperature at which a shape memorizing effect is displayed so as to cause the edges to resume their initial overhanging shape and close the micromodule in the cavity.

* * * * *